United States Patent
Tuominen

(10) Patent No.: US 12,306,231 B2
(45) Date of Patent: May 20, 2025

(54) APPARATUS AND A METHOD FOR TESTING RADIO-FREQUENCY TAGS

(71) Applicant: Voyantic Oy, Helsinki (FI)

(72) Inventor: Jesse Tuominen, Helsinki (FI)

(73) Assignee: VOYANTIC OY, Helsinki (FI)

(*) Notice: Subject to any disclaimer, the term of this patent is extended or adjusted under 35 U.S.C. 154(b) by 73 days.

(21) Appl. No.: 18/313,388

(22) Filed: May 8, 2023

(65) Prior Publication Data

US 2024/0369607 A1 Nov. 7, 2024

(51) Int. Cl.
*G01R 29/08* (2006.01)

(52) U.S. Cl.
CPC ............... *G01R 29/0871* (2013.01)

(58) Field of Classification Search
CPC .................................. G01R 29/0871
See application file for complete search history.

(56) References Cited

U.S. PATENT DOCUMENTS

| | | |
|---|---|---|
| 7,225,992 B2 | 6/2007 | Forster |
| 9,432,132 B2 | 8/2016 | Tuominen |
| 2004/0074974 A1* | 4/2004 | Senba ............. G06K 19/07728 343/866 |
| 2007/0018831 A1 | 1/2007 | Shanton |
| 2007/0279212 A1* | 12/2007 | Hong .................. G06K 7/0008 340/514 |
| 2011/0052792 A1* | 3/2011 | Shin ........................ H05K 3/12 427/8 |
| 2012/0169472 A1 | 7/2012 | Ikemoto |
| 2012/0299703 A1* | 11/2012 | Chen .................. G06K 19/0722 235/375 |
| 2013/0141222 A1* | 6/2013 | Garcia ............... G06K 7/10039 340/10.51 |
| 2014/0043168 A1* | 2/2014 | Schaible ................. F16P 3/147 340/686.6 |
| 2018/0121690 A1 | 5/2018 | Forster et al. |
| 2019/0109617 A1* | 4/2019 | Omori ............. G06K 19/07775 |
| 2022/0082610 A1 | 3/2022 | Gersten et al. |

* cited by examiner

*Primary Examiner* — Lee E Rodak
*Assistant Examiner* — Zannatul Ferdous
(74) *Attorney, Agent, or Firm* — Laine IP Oy

(57) ABSTRACT

There is provided a method for testing radio-frequency identification, RFID tags using a test apparatus including a coupling element for providing coupling to an RFID tag to be tested. The method comprises providing an electromagnetic field for coupling with the coupling element, coupling to the coupling element by a field converter, and providing a suitable field for coupling with an RFID tag by the field converter. There is provided an attachable/detachable electromagnetic field converter for a test apparatus.

17 Claims, 3 Drawing Sheets

# APPARATUS AND A METHOD FOR TESTING RADIO-FREQUENCY TAGS

FIELD

The present invention relates to radio-frequency identification, RFID, technology. The invention relates to an apparatus and method for testing RFID tags, on a production line, an accessory for such, and use of a test apparatus.

BACKGROUND

RFID tags are tested in their production process in order to detect and mark deficient ones. A deficiency may be detected by measuring the performance of RFID tags. For example measured frequency response indicates sensitivity and RF-bandwidth of an RFID tag. Inline testing poses challenges to accuracy and speed of the production process. In addition, RFID tags are implemented in multiple variations of size, shape and type. While one test equipment may not be suitable for all kinds of RFID tags, it is not reasonable to have optimized test equipment for all of them.

SUMMARY OF THE INVENTION

Aim is to enable inline testing of different kind of RFID tags effectively.

The invention is defined by the features of the independent claims. Some embodiments are defined in the dependent claims.

According to a first aspect of the present invention, there is provided an electromagnetic field converter configured to couple radio frequency identification, RFID, tags to a test apparatus, wherein the electromagnetic field converter is configured to convert an electromagnetic field of the test apparatus to an electromagnetic field suitable for the RFID tag.

According to a second aspect of the present invention, there is provided a test apparatus for testing radio frequency identification, RFID, tags, comprising:
  a test zone for an RFID tag to be tested,
  a coupling element configured to provide a coupling with an RFID tag in the test zone, and
  a field converter configured to couple with the coupling element, wherein the field converter is configured to provide an electromagnetic field suitable for coupling with the RFID tag at the test zone, and wherein the field converter is detachably attachable to the test apparatus.

According to a second aspect of the present invention there is provided a method for testing radio-frequency identification, RFID, tags using a test apparatus including a coupling element for providing coupling to an RFID tag to be tested, the method comprising:
  providing an electric field for coupling by the coupling element,
  coupling to the coupling element by a field converter, and providing an electromagnetic field suitable for coupling with an RFID tag by the field converter.

According to a third aspect of the present invention, there is provided use of the test apparatus of the second aspect for testing near field RFID tags.

BRIEF DESCRIPTION OF THE DRAWINGS

In the following, embodiments are discussed in more detail with reference to the attached drawings, of which.

Figures are presented as illustrative examples and embodiments may not be limited solely to the illustrated parts, but modifications may be made under the scope as defined in the claims. Figures that may not fully present the claimed invention, aim to provide better understanding on the context and relating technical field.

DESCRIPTION OF EMBODIMENTS

There is provided a field converter, which is attachable to and detachable from a test apparatus. The field converter enables modifying electromagnetic field of the test apparatus, and the testing of different type and kind of radio-frequency identification, RFID, transponders or tags using the same test apparatus. An electromagnetic field of the test apparatus is converted to be suitable for the RFID tags, for type of the RFID tags, or for coupling with RFID tags, under the test. An electromagnetic field suitable for coupling with an RFID tag may refer to an electromagnetic field compatible with the RFID tag or coupling with such, or matching with the RFID tag, or enabling pairing with the RFID tag. For suitability and/or conversion one or more of the following parameters may be adapted: field polarization, field concentration, loading based tag detuning, electromagnetic field type, differential field separation, etc.

Figure 1:
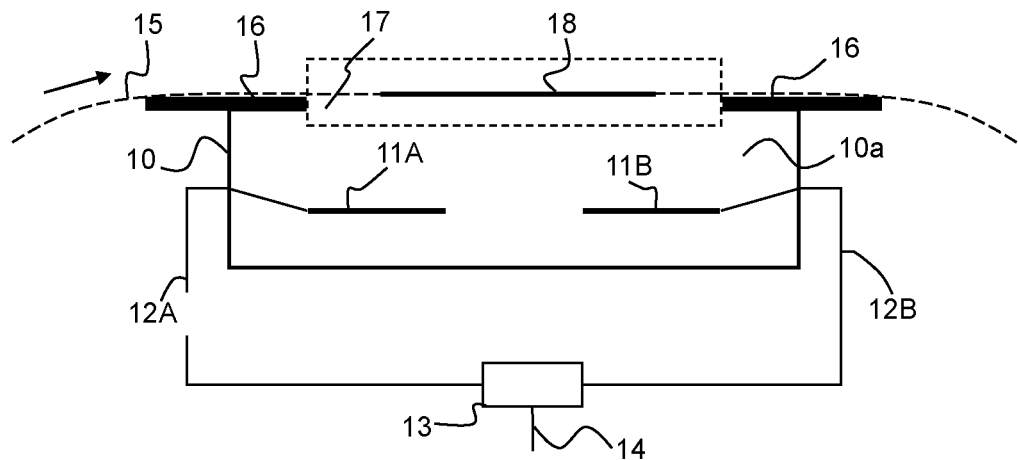
FIG. 1 illustrates, by way of an example, a side view of a test apparatus for RFID tags.

FIG. 1 illustrates, by way of an example, a side view of a test system for RFID tags. The test system comprises a housing 10, which is configured to define a volume or space 10a within inner walls of the housing. The housing 10 may be electrically conductive. The housing 10 has an opening on one side, in FIG. 1 on its upper side. The opening enables arranging a reading zone or a test zone 17 for an RFID tag 18. Plurality of RFID tags may be arranged to be fed to the test zone 17 in a continuous manner, e.g. on a roll 15. The housing 10 is configured to enclose, within its inner walls, conductive electrodes 11A, 11B. The electrodes 11A, 11B are connected to a coupler 13, for example via wires 12A, 12B. The coupler 13 is connected to a communication terminal 14. The communication terminal 14 is configured to feed an excitation signal via the coupler 13 to the electrodes 11A, 11B and to read the response signal received from the electrodes 11A, 11B via the coupler 13.

An excitation signal, fed by the communication terminal 14, is split into two signals having a phase difference and then fed to the electrodes 11A, 11B, which has effect on the capacitive field inside the housing 10 and at the test zone 17. The housing 10 is dimensioned such that electric field does not significantly couple to the housing or via the housing between the electrodes 11A, 11B, but rather the electric field is configured to couple to an RFID tag 18 at the test zone 17. When the RFID tag 18 is capacitively coupled to the electrodes 11A, 11B, the RFID tag 18 is activated and configured to provide a response signal. The response signal may be detected by the electrodes 11A, 11B and passed to the coupler 13. The coupler 13 is configured to combine the differential response signals and the combined response signal may be read from the communication terminal 14.

Figure 2:
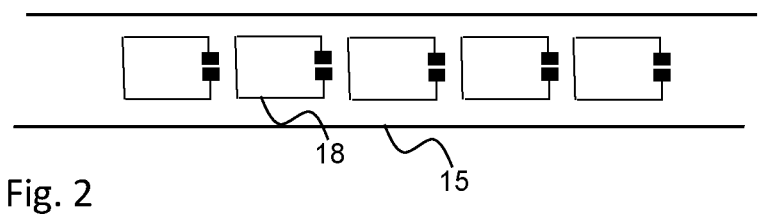
FIG. 2 illustrates, by way of an example, a roll of RFID tags.

FIG. 2 illustrates, by way of an example, a roll of RFID tags. The RFID tags 18 may be arranged on a continuous roll 18, a line or a conveyor belt, for example. The RFID tags 18 may be supplied to a test zone (17 of FIG. 1) one by one on a roll 15 or alike continuous support, which is configured to be conveyed through the test zone (17 of FIG. 1). Plurality of RFID tags may be continuously fed to a test zone and tested inline. Two or more continuous feeds of RFID tags may be arranged to be tested in parallel. RFID tags 18 having elongated shape may be fed to the reading zone along their longitudinal or transverse direction.

A test apparatus, or a reader, is configured to communicate with an RFID tag via electromagnetic coupling. Electromagnetic field originating from an RFID antenna may be divided into a near field and a far field. A near field may be around a coupling element, e.g. antenna, up to one wavelength ($\lambda$), or order of a few centimeters in the ultra high frequency, UHF, range, while a far field may be up to 10 meters or order of meters in the case of UHF RFID. The near field and the far field differ in their energies and types of coupling: the near field can make use of inductive coupling or capacitive coupling alone, while in the far field the electric and magnetic field components are always both present and in a known ratio. RFID testing in production line is done predominantly in the near field, therefore the RFID tags to be tested and the used test apparatus should have mutually matching coupling elements, e.g. antenna types, in order to ensure coupling and reliable test results. For example, a far field antenna typically creates an electric field, which will evolve into a combination of electric and magnetic fields in the far field. A far field RFID tag is sensitive to this electric field component, which is used to energize them. Once energized, the RFID tag can reflect back in a modulated manner a portion of the RF energy. In UHF RFID this is referred to as tag backscatter. Small close range tags are sometimes designed to operate using inductive coupling. This type of tag will need a near field reader antenna, or coupling elements, to generate the magnetic field to energize the RFID tag. A magnetic field is created in the near field region in order to allow the test apparatus coupling elements to energize an RFID tag under test. The energized RFID tag may reply by modulating a reflected signal in the magnetic field, which the test apparatus detects and decodes. Practically all tag testing is done at a very short distance from the tested tag, that is, in near filed. This leads to the fact that different test apparatus is required for testing different kind of RFID tags.

Figures 3A, 3B, 3C:
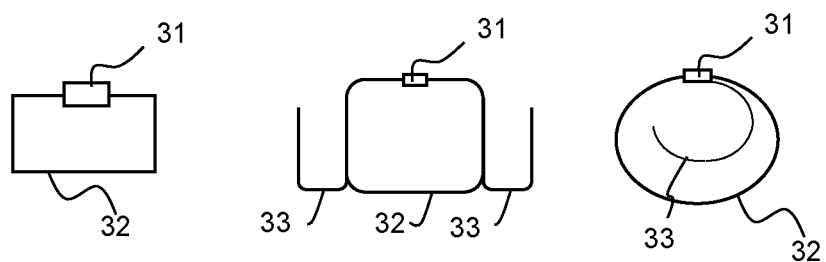
FIGS. 3a-3c illustrate, by way of an example, RFID tags.

FIGS. 3a, 3b and 3c illustrate, by way of an example, RFID tags. The illustrated RFID tags are some of the near field tag types used in the UHF frequencies. UHF refers to frequencies of 0.3-3 GHz according to ITU (International Telecommunication Union), and frequencies of 0.3-1 GHz according to IEEE (Institute of Electrical and Electronics Engineer). The illustrated RFID tags differ among each other in shape such that FIG. 3a shows a sharp edged loop tag, FIG. 3b shows a tag having rounded edges and FIG. 3c shows a round shaped tag. All the RFID tags of FIGS. 3a-3c comprise a chip 31 and a loop antenna 32. The RFID tags may be passive. FIG. 3a illustrates a simple loop tag. FIGS. 3b comprises additional conductors 33 external to the loop 32. The conductors may be in form of a wire or a foil, for example. FIG. 3c comprises an additional conductor 33 inside the loop 32. The antenna loop 32 with additional conductors 33 may have effect of extending range of the antenna. However, with small sized, near field RFID tags, read range may include meters, but the RFID tags still lack far field properties. Generally, a loop antenna represents an inductive antenna, which reacts to magnetic field, which induces a current in the loop of the RFID tag.

FIGS. 3a-3c illustrate only examples of RFID tags, which may have multiple different shapes and constructions. Different kind of RFID tags pose different requirements for inline testing and test apparatus. For example, typically shape and size of a test zone 17 of a test apparatus corresponds to a shape and size of the RFID tags 18 to be tested. The test zone 17 is enabled via the opening of the housing 10. The test zone 17 is arranged in the vicinity of the opening of the housing 10. Opening may be larger in areal dimensions than the area of an RFID tag 18 to be tested. Location, size and shape of the opening have direct effect to the same of the test zone 17. A conductive plate 16 may be deployed in electrical connection with the housing 10, on the opening. The conductive plate 16 including an opening, e.g. a central opening, may be selected according to desired shape and dimensions of the test zone 17. The conductive plate 16 may be attachable to and detachable from the housing 10. The plate 16 may be shaped, e.g. curved, in order to contribute sliding of the roll 15 of the RFID tags 18 on its surface.

FIGS. 3a-3c illustrate examples of passive RFID tags, which are configured to function in near field. Compared to far field tags, coupling elements or antennas, the illustrated RFID tags are small in size and have shorter range. As discussed in the previous, an antenna, or coupling elements, of a test apparatus shall match antennas, or coupling elements, of the RFID tags to be tested. The matching here may refer to type, size, shape, and generally contribute to coupling between the antennas, or coupling elements.

Figure 4:
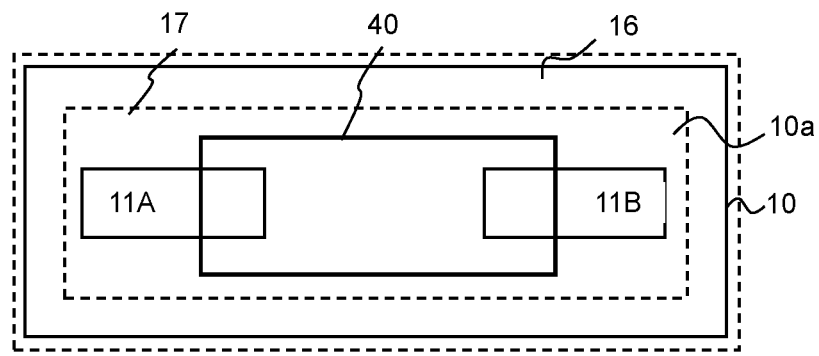
FIG. 4 illustrates, by way of an example, a top view of a test apparatus.

FIG. 4 illustrates, by way of an example, a top view of a test apparatus. Electrodes 11A, 11B are enclosed in a housing 10. The housing 10 is configured to outline a unitary volume or space 10a. A conductive plate 16 is illustrated between dotted lines in FIG. 4. The conductive plate 16 is placed on top of opening of the housing 10 in order to outline a test zone 17 for the RFID tags to be tested. The test apparatus is initially configured for far field RFID tags using its conductive plates to capacitively couple to dipole type tags of similar scale. In case near field tags are to be tested, a field converter 40 may be introduced. The field converter 40 is an attachable/detachable part for the test apparatus. Attachment/detachment of the field converter 40 enables testing both near and far field RFID tags without changing the test apparatus. The field converter 40 is configured to couple with the electric field, caused by the electrodes 11A, 11B, and to provide a near field for an RFID tag to be tested. Use of a field converter 40 enables to modify a capacitive near field of the test apparatus to an inductive near field. This way the same apparatus may be used for different kind of RFID tags. In addition, field converters 40 of different designs may be employed to match with further variation of RFID tags to be tested. This provides means for configuring the position, distance, shape and/or size of the electrodes of a test apparatus in order to match with various tag types and shapes.

Figure 5:
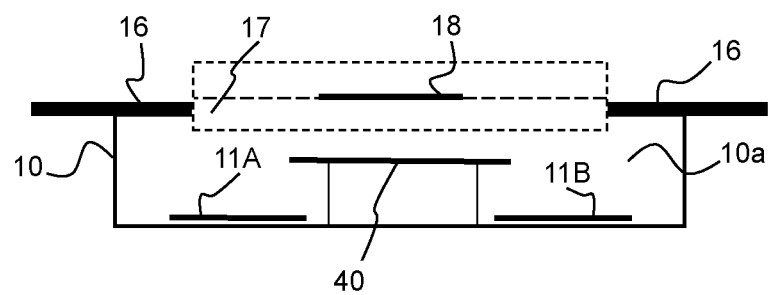
FIG. 5 illustrates, by way of an example, a side view of a test apparatus.
Figure 6A:
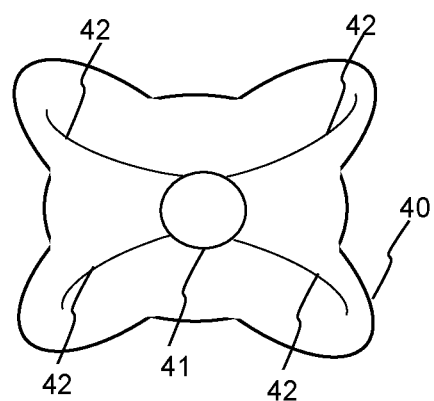
FIGS. 6a-6d illustrate, by way of an example, a field converter.
Figure 6B:
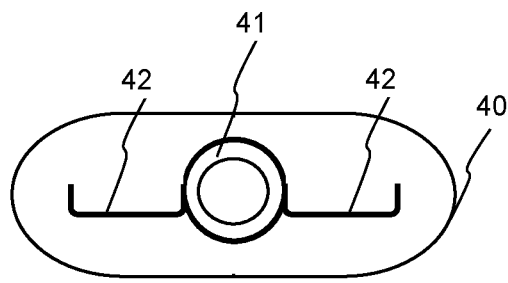
Figures 6C, 6D:
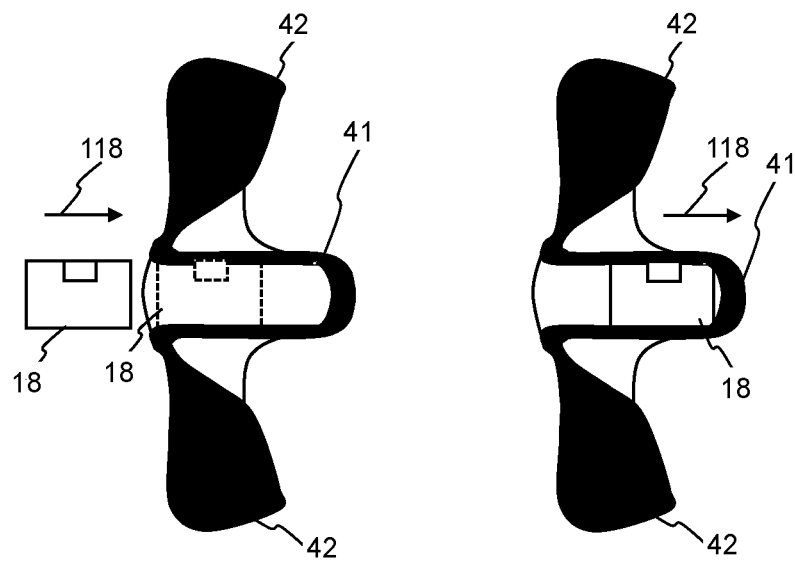

FIG. 5 illustrates, by way of an example, a side view of a test apparatus. The test apparatus of FIG. 5 corresponds to that of FIG. 4, and the same parts are referred with the same reference numbers. Electrodes 11A, 11B may be deployed as patterns on a printed circuit board, PCB, which is placed inside the housing 10. The electrodes 11A, 11B, and a field converter 40 are within an unitary volume 10a, defined by the inner walls of the housing 10. An RFID tag 18 at a test zone 17 is a near field RFID tag. It may lack connection to the electrodes 11A, 11B. A distance between outer ends of the electrodes 11A, 11B is configured to be approximately the same as the length of the antenna of the RFID tag 18 to be tested. The distance between the outer ends of the electrodes 11A, 11B may be within ±25% of the length of the antenna of the RFID tag 18 to be tested. A near field RFID tag 18 might not match with the placement of the electrodes 11A, 11B, since those are planned for bigger far field RFID tags, while the near field RFID tag 18 has small dimensions. In addition, inductive coupling is used with near field RFID tags, and the same should be tested in order to provide reliable results. Testing of near field RFID tags is enabled by introducing the field converter 40 to the test apparatus. The field converter 40 may be placed between the electrodes 11A, 11B and the test zone 17. A horizontal plane of the electrodes 11A, 11B may correspond to a horizontal plane of the PCB. The test zone 17, or a horizontal plane of it, is at a certain distance from the horizontal plane of the electrodes 11A, 11B. A horizontal plane of the field converter 40 is placed between the two. The horizontal planes of the electrodes 11A, 11B, the reading zone 17 and the field converter 40 may be parallel. The electrodes 11A, 11B, are physically separated from the field converter 40. The field converter 40 may have legs or touch points, via which it is supported to the PCB or to the housing 10. The field converter 40 is arranged on top of the electrodes 11A, 11B such that it at least partly covers both electrodes 11A, 11B, when seen from the test zone 18. This may enhance coupling between the field converter 40 and the electrodes 11A, 11B. The field converter 40 is placed closer to the reading zone 17 than the electrodes 11A, 11B. This may enhance the near field coupling with the RFID tag 18 to be tested.

A field converter, or an electromagnetic field converter, may be used with different kind of test apparatuses. A test apparatus may comprise different structure, comprising various kind and/or number of parts and/or coupling elements, for example replacing electrodes 11A, 11B. A coupling element is configured to arrange coupling with tested RFID tags. A coupling element may comprise an antenna, one or more electrodes, a coupler or alike means for coupling, optionally in near field. Coupling elements illustrated in the Figs. and in the description may be replaced by other kind of coupling elements.

FIGS. 6a-d illustrate, by way of an example, a field converter. Field converter 40, or an electromagnetic field converter, may be of a different shape or size, not limited by the examples illustrated in the FIGS. 6a-d. A field converter 40 comprises an antenna part 42, or a coupling element, and a conductor part 41. The antenna part 42 may comprise a dipole antenna. The conductor 41 may be arranged to form a magnetic coil. Antenna parts 42 may extend towards edge parts of the field converter 40. The conductor 41 may be placed in the middle of the field converter 40. The field converter 40 is arranged to convert an electric field of an antenna for inductive coupling to a loop tag. The field converter 40 may be arranged to convert an electric field of an antenna to a confined and/or focused electric field. The confined and/or focused electric field is suitable for a tag otherwise too small for the antenna. The field converter 40 is able to direct the coupling electric field such that it matches with the dimensions and arrangement of the tags to be tested. The field converter 40 is arranged to match a test apparatus or setup to the tags to be tested. A field converter illustrated in the FIGS. 6c-d enables extending the coupling area. In the FIGS. 6c-d a field converter comprises a partial loop 41, which may be an incomplete loop of three quarters. The loop is placed in the centre of the field converter, which may be arranged to convert a capacitive field to an inductive field. The loop may have elongated form. A field converter may comprise a dipole element configured to couple to an electric field antenna and a conductor, or a loop, for providing an inductive near field. The conductor may be looped back to itself in an elongated fashion. This enables extending the coupling time of a moving tag. The conductor may comprise a form of an open loop, like an elongated letter U or C. The loop may form a pair of conductor rails for a tag 18 along its direction of movement, which is illustrated with an arrow 118 in the FIGS. 6c-d. A tag 18, like a near field tag, is illustrated to move in order to pass a test point. The loop of the tag 18 is arranged to couple with the loop 41 of the field converter. As the tag 18 passes over the test point, its coupling to the field converter remains strong and uniform along the loop 41 of the field converter. This enables steady coupling to a moving tag, during an extended time and/or range of movement, correspondingly. The time of testing is extended without reducing speed of a production line. Reliable tests may be performed without compromising the production speed. In addition, the test setup or apparatus is adjustable for different kind of tags by use of the field converter.

Figure 7:
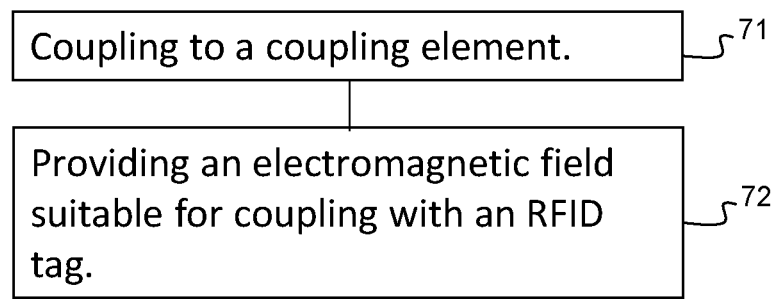
FIG. 7 illustrates, by way of an example, a method for testing RFID tags.

FIG. 7 illustrates, by way of an example, a method for testing RFID tags. The method may comprise providing a capacitive coupling by an antenna or a coupling element. The antenna is part of a test apparatus for testing RFID tags. The method comprises coupling to the antenna 71 and providing an electromagnetic field suitable for coupling with an RFID tag 72. This is implemented by an electromagnetic field converter, which may be detachably attachable to the test apparatus.

In the previous description and figures the test apparatus is presented with two electrodes. However, one electrode may be present instead, and there may be further different designs and constructions. A test apparatus comprising a far field antenna may be converted for a near field antenna by introducing an attachable/detachable field converter. The field converter is configured to capacitively couple with the far field antenna of the test apparatus and to provide an inductive near field. The far field antenna of the test apparatus and the near field antenna of the field converter are separated, or lack physical contact. The field converter may be detachably attached to the test apparatus between the far field antenna and a test zone. Different kind of field converter shapes and designs may be used, depending, for example, on a model and a size of a test apparatus, location of a far field antenna of a test apparatus, a size of a reading zone, a distance between a far field antenna and a reading zone. The field converter may be a plane-like part including projections, which may aid in coupling with the original antenna of the test apparatus. Further, a field converter shall be matched with the RFID tag to be tested.

Efficiency of testing may be improved by ensuring coupling with the RFID tag to be tested, as discussed in previous. In addition, coupling should be maintained long enough to enable functional testing on a continuously moving production line. RFID tags may continuously propagate for example 10 m/s, which means that a test time for a single RFID tag may be approximately 10 ms. On production point of view, faster throughput time is desired, thus the test time is seen to decrease. A field converter may enable extending a test zone along the direction of movement, by extending the inductive conductors of the test apparatus, along the running direction of RFID tags. This enables providing extended time for testing, and thus efficiency and reliability to coupling. Good and reliable coupling enable the use of less energy for testing or energizing RFID tags. This enables testing using less power, causing less disturbances and losses, and avoiding the activation of neighbouring tags. Too much power may energize neighbouring tags and thus disturb testing. A lower test power also reduces crosstalk between multiple test systems.

An attachable/detachable field converter, or modifier, enables to modify a field of a test apparatus in accordance to RFID tags to be tested. A single test apparatus may be modified for different type of RFID tags, and may be used for both far field and near field RFID tags. This avoids need of a specific test apparatus for each RFID tag type. A test apparatus suitable for far field RFID tags may be modified for near field or loop tags. The attachable/detachable field converter enables providing the test antenna, or coupling element, physically closer to a reading zone and/or an RFID tag under test. In one embodiment, the field converter is configured to collect a capacitive field of the test apparatus and to transform it into an inductive field, which corresponds to the inductive field of an RFID tag under test. Better coupling is achieved between the test apparatus and the RFID tag under test. The RFID tag, as excited by the inductive field, is configured to cause a response signal in the magnetic field, which is passed on by the field converter as a change in the capacitive coupling. Via the field converter the signal is carried through the capacitive coupling and the electrodes, to the communication terminal, which supplied the excitation signal to the test apparatus. Thus, the field converter requires no changes to controlling the test apparatus connected to the communication terminal or alike control device. The field converter is configured to reciprocally exchange information between an antenna, or a coupling element, of the test apparatus and the RFID tag under test.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

The described features, structures, or characteristics may be combined in any suitable manner in one or more embodiments. In the previous description, numerous specific details are provided, such as examples of structures, lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

The invention claimed is:

1. A test apparatus for testing radio frequency identification, RFID, tags on a production line, comprising:
   a test zone for an RFID tag to be tested,
   a housing which comprises an opening configured to form at least partly the test zone,
   a coupling element configured to provide a coupling with an RFID tag in the test zone, and
   a field converter, which is detachably attachable to the test apparatus, such that the coupling element and the field converter are placed in the housing, the field converter configured to couple with the coupling element, wherein the field converter is configured to provide an electromagnetic field suitable for the RFID tag at the test zone,
   wherein the detachably attachable field converter is configured to modify the electromagnetic field of the test apparatus in accordance with the RFID tag to be tested.

2. The test apparatus according to claim 1, comprising a conductive plate placed on top of the opening of the housing in order to outline the test zone.

3. The test apparatus according to claim 1, wherein the coupling element and the field converter are placed in a unitary space, which is defined by the housing.

4. The test apparatus according to claim 1, wherein the field converter is placed between the coupling element and the test zone.

5. The test apparatus according to claim 1, wherein the field converter is physically separated from the coupling element.

6. The test apparatus according to claim 5, wherein the coupling element comprises at least one electrode or an antenna.

7. The test apparatus according to claim 1, wherein the field converter is arranged to at least partly cover the coupling element towards the test zone.

8. The test apparatus according to claim 1, wherein the field converter is configured to capacitively couple with the coupling element.

9. The test apparatus according to claim 1, wherein the field converter is configured to transmit data via the coupling based on a detected response from the RFID tag at the test zone.

10. The test apparatus according to claim 1, wherein the testing comprises inline testing of multiple tags in succession.

11. The test apparatus according to claim 1, wherein the field converter is configured to provide an inductive magnetic field for testing RFID tags in ultra high frequencies, UHF.

12. The test apparatus according to claim 1, wherein the field converter comprises a dipole element configured to couple to an electric field of the coupling element and a conductor for providing an inductive near field, wherein the conductor is configured to loop back on itself.

13. The test apparatus according to claim 12, wherein the conductor is configured to loop back on itself in an elongated fashion.

14. The test apparatus according to claim 1, wherein a plurality of RFID tags are arranged to be conveyed through the test zone.

15. A method for testing radio-frequency identification, RFID, tags on a production line using a test apparatus for testing RFID tags on a production line, the test apparatus comprising:
    a test zone for an RFID tag to be tested,
    a housing which comprises an opening configured to form at least partly the test zone,
    a coupling element configured to provide a coupling with an RFID tag in the test zone, and
    a field converter configured to couple with the coupling element, wherein the field converter is configured to provide an electromagnetic field suitable for the RFID tag at the test zone, and wherein the field converter is detachably attachable to the test apparatus, such that the coupling element and the field converter are placed in the housing, the method comprising:
    coupling the RFID tag to the coupling element by a field converter, which is detachably attached to the test apparatus, and
    providing an electromagnetic field suitable for coupling with an RFID tag to be tested at the test zone by the field converter
    wherein the detachably attachable field converter is configured to modify the electromagnetic field of the test apparatus in accordance with the RFID tag to be tested.

16. A method according to claim 15, comprising continuously feeding a plurality of RFID tags through the test zone and testing inline.

17. A method according to claim 15, comprising supplying the RFID tags to the test zone one by one on a roll or similar continuous support, which is configured to be conveyed through the test zone.

* * * * *